(12) United States Patent
Hashiguchi et al.

(10) Patent No.: US 7,322,622 B2
(45) Date of Patent: Jan. 29, 2008

(54) NANO-GRIPPER AND METHOD OF PRODUCING SAME

(75) Inventors: Gen Hashiguchi, Takamatsu (JP); Yutaka Mihara, Takamatsu (JP); Takeo Fukino, Takamatsu (JP); Takafumi Hara, Okayama (JP); Hiroyuki Fujita, Tokyo (JP)

(73) Assignees: Techno Network Shikoku Co., Ltd., Kagawa (JP); AOI Electronics Co., Ltd., Kagawa (JP)

( * ) Notice: Subject to any disclaimer, the term of this patent is extended or adjusted under 35 U.S.C. 154(b) by 271 days.

(21) Appl. No.: 10/834,564

(22) Filed: Apr. 28, 2004

(65) Prior Publication Data

US 2005/0029827 A1    Feb. 10, 2005

Related U.S. Application Data

(63) Continuation of application No. PCT/JP01/10443, filed on Nov. 29, 2001.

(51) Int. Cl.
*B25J 7/00* (2006.01)
(52) U.S. Cl. ...................... 294/86.4; 977/962
(58) Field of Classification Search ............... 294/86.4, 294/99.1, 99.2; 901/30, 36, 39; 977/962
See application file for complete search history.

(56) References Cited

U.S. PATENT DOCUMENTS

| 6,669,256 B2* | 12/2003 | Nakayama et al. ........ 294/99.1 |
| 2002/0061662 A1* | 5/2002 | Boggild ...................... 438/800 |

FOREIGN PATENT DOCUMENTS

| EP | 0696497 A1 | 2/1996 |
| JP | 55-34311 | 8/1980 |
| JP | 05-293778 | 11/1993 |
| JP | 2001-150394 | 6/2001 |

* cited by examiner

*Primary Examiner*—Saul Rodriguez
*Assistant Examiner*—Paul T Chin
(74) *Attorney, Agent, or Firm*—Beyer Weaver LLP

(57) ABSTRACT

The nano-gripper of the present invention comprises (i) a pair of arms 71 and 71 disposed side by side, each arm 71 having a face at its front end, the front-end faces of the arms 71 and 71 facing each other, (ii) and a protrusion 72 with a tip formed on the front-end face of each arm, the tips of the protrusions 72 and 72 facing each other, the radius of curvature of each tip being 50 nanometers or less. Each protrusion 72 is a triangular-pyramidal silicon crystal with (001), (100), and (111) side faces.

12 Claims, 16 Drawing Sheets

(XII) Formation of aluminum film 8 and resist film 90 on the back of base layer 1

(XV) Etching of Silicon-Oxide film 32 to finish the Micro-Gripper

NANO-GRIPPER AND METHOD OF PRODUCING SAME

This application is a continuation of copending prior-filed International (designating the United States) Application No. PCT/JP01/10443, filed Nov. 29, 2001, from which priority is claimed.

TECHNICAL FIELD

This invention relates to a nano-gripper and its production process. With a pair of tweezers, objects of the order of magnitude of millimeters such as grains of rice and hairs can be caught and handled, but objects of the order of magnitude of nanometers such as DNA's, particles on a liquid-crystal panel, and particles on a very-large-scale integrated-circuit board cannot be handles because the tips of tweezers are not sharpened to the order of magnitude of nanometers. This invention relates to (i) a nano-gripper with a pair of arms to catch and handle nano-objects such as DNA's and (ii) the production process of the nano-gripper.

BACKGROUND ART

The minimum requirement of a nano-gripper is the tips of its arms such that their size is equal to or smaller than the size of objects to be handled. To handle nano-objects such as DNA's in particular with a nano-gripper, the tips of its arms have to be as minute as 50 nanometers or less. Such a nano-gripper is made by attaching carbon nano-tubes to the tips of probes for an interatomic-force microscope. Nano-grippers are also produced by electron-beam deposition and electric-field vapor-deposition methods. A known nano-gripper is twin probes with integrated actuators, which are made of silicon nano-wire produced by the electron-beam deposition or electric-field vapor-deposition method, or the anisotropy etching of silicon.

The nano-grippers currently in use and their production methods have the problems below.

(i) Arms for current nano-grippers made of carbon nano-tubes or silicon nanowire or produced by the electron-beam deposition or electric-field vapor-deposition method are pillar-like, or post-like, slim members. Such a member is flexible in proportion to the $3^{rd}$ power of its length (it bends easily under force applied to its tip). If such a member has a circular cross section, it is flexible in inverse proportion to the $4^{th}$ power of its diameter. In other words, slim members such as nanowire have very small strength against bending force. DNA's and particles on VLSI boards are minute and have to be handled in a solution to prevent them from scattering or drying. While the tips of arms of a current nano-gripper are dipped in such a solution, its probe structure is affected by the viscosity of the solution.

(ii) According to the electron-beam deposition or electric-field vapor-deposition method, arms in conformity with individual specifications are produced one by one in a vacuum device; therefore, highly controllable arms can be produced, but their industrial mass production is difficult. In addition, because a nano-gripper with an actuator of the order of magnitude of nanometers cannot be produced by the electron-beam deposition method or the like, it is difficult to control the gaps between the tips of arms of nano-grippers minutely.

(iii) The production of twin probes with integrated actuators requires the steps of making a special composite board unavailable on the market and the extremely precise management of etching conditions; therefore, the production process of such twin proves with integrated actuators is too complex. If the management of etching conditions is inadequate, mass production with high repeatability and uniformity of such twin probes with integrated actuators is impossible.

(iv) Although the tips of arms of a nano-gripper can be sharpened with high precision of the order of magnitude of nanometers with high-precision lithography, such lithography is costly.

In view of the above, an object of the present invention is to provide a nano-gripper which has, on its arms' tips, protrusions with a radius of curvature of the order of magnitude of nanometers formed without using high-precision lithography. Even when the nano-gripper is used to handle DNA's, etc. in a solution, its probe structure is not affected; therefore, the operator can control the gap between the protrusions easily and precisely. The nano-gripper can be mass produced easily, inexpensively. Another object of the present invention is to provide the process of producing the nano-gripper.

DISCLOSURE OF INVENTION

According to the first feature of the present invention, there is provided a nano-gripper comprising (i) a pair of arms disposed side by side, each arm having a base portion, the base portions of the arms being fixed to a base, each arm having a face at its front end, the front-end faces of the arms facing each other. The pair of protrusions is formed by etching a silicon crystal disposed between the front-end faces and the silicon crystal has a silicon-oxide film parallel to a 100 face of the silicon crystal and perpendicular to the front-end faces.

According to the second feature of the present invention, there is provided the nano-gripper of the first feature, wherein each of the protrusions is a triangular-pyramidal silicon crystal with (001), (100), and (111) side faces.

According to the third feature of the present invention, there is provided the nano-gripper of the first or second feature, which further comprises a pair of actuators, one of the actuators moving one of the arms and the other actuator moving the other arm to narrow and widen the gap between the tips of the protrusions.

According to the fourth feature of the present invention, there is provided the nano-gripper of the third feature, wherein the actuators are of a type of thermal expansion.

According to the fifth feature of the present invention, there is provided the nano-gripper of the fourth feature, wherein each of the thermal expansion-type actuators comprises a pair of expandable and contractable silicon arms and each arm has an electrode for letting electricity flow through the arms.

According to the sixth feature of the present invention, there is provided a process of producing a nano-gripper with a pair of arms disposed side by side by using a base board including a insulating layer and a silicon layer with 001 facial orientation. The process comprises the steps of (i) forming a long, narrow mask in the 010 direction in such a position on the top surface of the silicon layer as one of the arms is formed on one side of the mask and the other arm is formed on the other side of the mask, (ii) forming resist patterns on the silicon layer, the resist patterns corresponding in shape and position to the arms to be formed, (iii) etching the silicon layer to form a gripper-in-work with the mask, (iv) removing the resist patterns from the gripper-in-work, (v) oxidizing the exposed surface of the gripper-in-work with heat to change the surface into a silicon-oxide film, (vi) removing the mask from the gripper-in-work to expose the silicon zone below the mask, (vii) corroding the silicon zone of the gripper-in-process with aqueous solution of potassium hydroxide, and (viii) removing the silicon-oxide film from the gripper-in-process.

According to the seventh feature of the present invention, there is provided a process of producing a nano-gripper having a pair of arms fixed to a base, each arm having a face at its front end, the front-end faces of the arms facing each other, a protrusion being formed on the front-end face of each arm. The process comprises the steps of (i) forming a long, narrow mask in the <010> direction in such a position on the top surface of a silicon layer of 001 facial orientation of a base board as one of the arms is formed on one side of the mask and the other arm is formed on the other side of the mask, (ii) forming a gripper-in-work out of the silicon layer, each arm having a front-end face of 100 facial orientation, the front-end faces of the arms and the front end of the mask constituting a single face, (iii) forming a silicon-oxide film on the exposed surface of the gripper-in-work, and (iv) removing the mask from the gripper-in-work to expose the silicon zone under the mask and etching the silicon zone.

According to the eighth feature of the present invention, there is provided the nano-gripper of the first or second feature, wherein the paired arms and the paired protrusions are formed out of a single base silicon crystal by forming silicon-oxide film on the face of 100 facial orientation except narrow, long part of the face extending in the <010> direction and etching the exposed narrow, long silicon part.

According to the ninth feature of the present invention, there is provided the nano-gripper of the eighth feature, wherein one end of the narrow, long part of the face is formed parallel to the face of 100 facial orientation.

BRIEF DESCRIPTION OF DRAWINGS

The features and advantages of the present invention will become more clearly appreciated from the following description in conjunction with the accompanying drawings, in which.

BEST MODE FOR CARRYING OUT THE INVENTION

Figure 1:
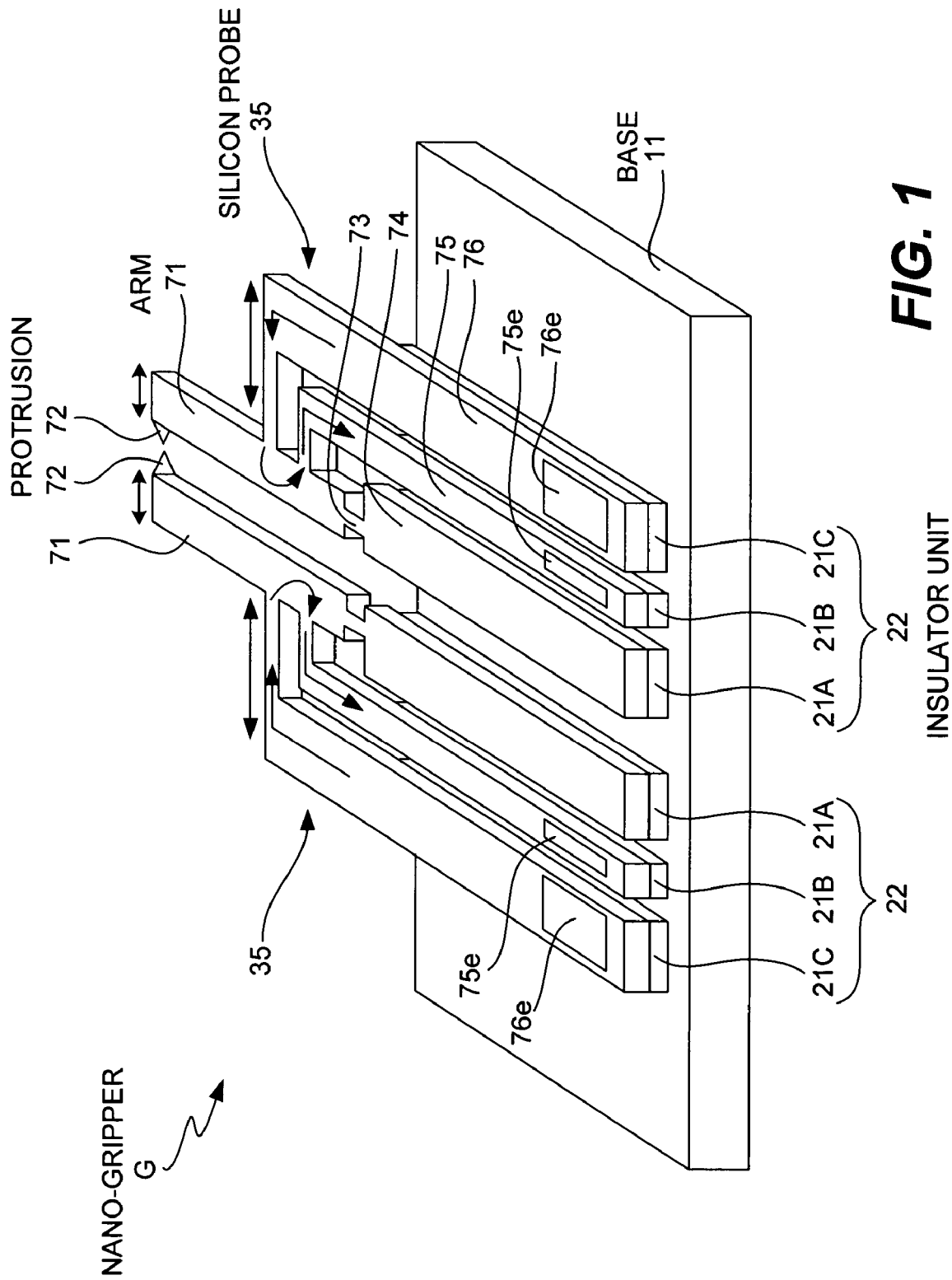
FIG. 1 is a schematic perspective view of an embodiment of the nano-gripper of the present invention.

Referring to the drawings, a preferred embodiment of the nano-gripper of the present invention will now be described.

In FIG. 1, the reference numeral "G" is the nano-gripper, which comprises a pair of right and left silicon probes 35 and 35 formed on a pair of right and left insulator units 25 22 and 22, which are formed on a base 11. Each silicon probes 35 has an arm 71.

Each arm 71 has a face at its front end, and the front-end faces of the arms 71 and 71 face each other. A protrusion 72 is formed on each front-end face, the tips of the protrusions 72 and 72 on the front-end faces facing each other. Each protrusion 72 is a silicon crystal in the shape of a triangular pyramid with (001), (100), and (111) side faces. Parts 75 and 76 of each silicon probe 35 constitute an actuator and are provided with electrodes 75e and 76e, respectively. When electricity between the electrodes 75e and 76e of silicon probes 35 is turned on and off, the actuators expand and contract thermally; accordingly, the paired arms 71 and 71 swing on hinges 73 and 73, widening and narrowing the gap between the tips of protrusions 72 and 72. Thus, the nano-gripper G catches and releases an object. Besides, as the radii of curvature of the tips of the protrusions 72 and 72 are 50 nm or less, the nano-gripper can handle nano-objects such as DNA's, catching and releasing them.

Now, the process of producing the nano-gripper will be described below.

Figure 2:
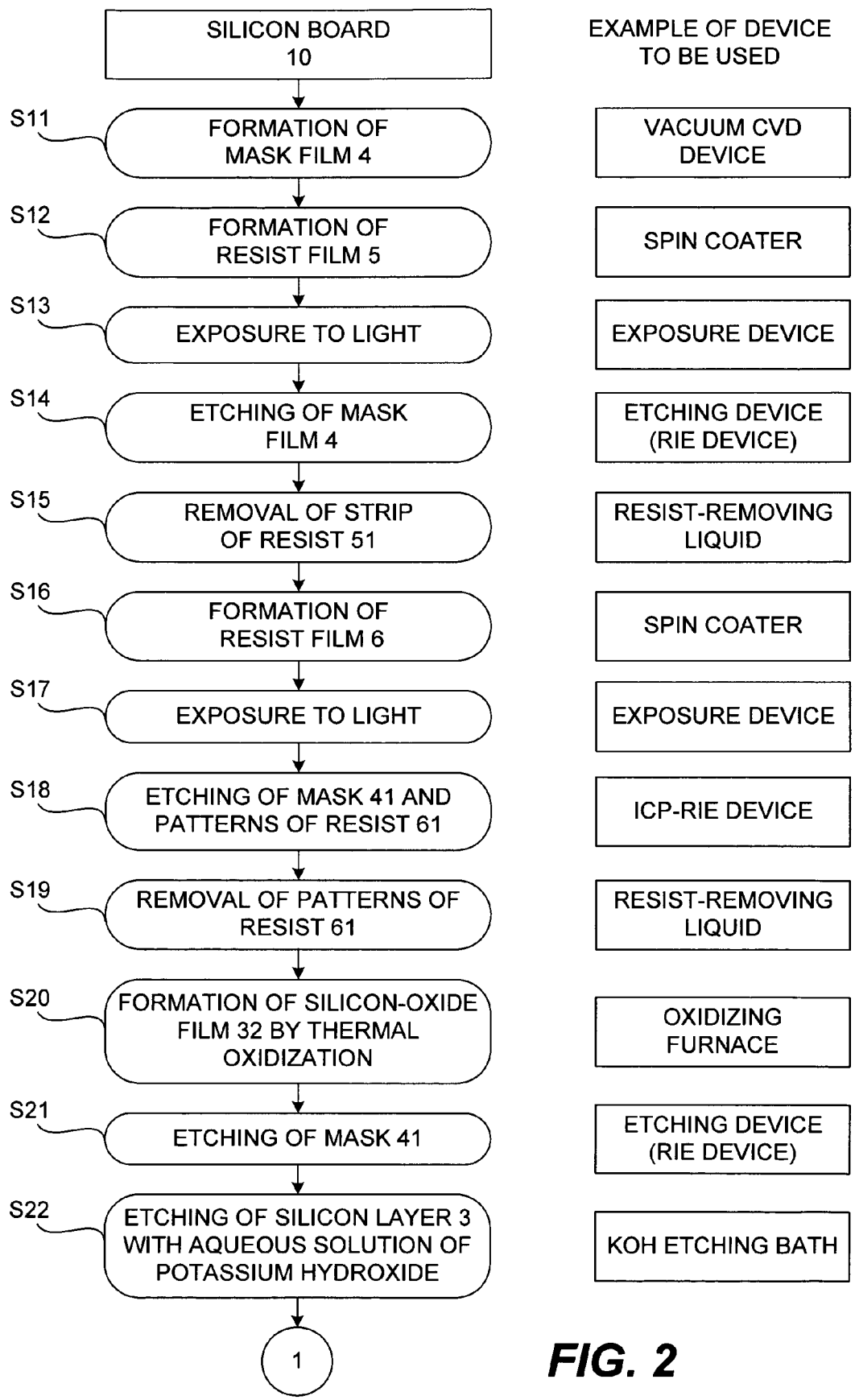
FIGS. 2 and 3 is a flowchart of the process of producing the nano-gripper of FIG. 1.
Figure 4:
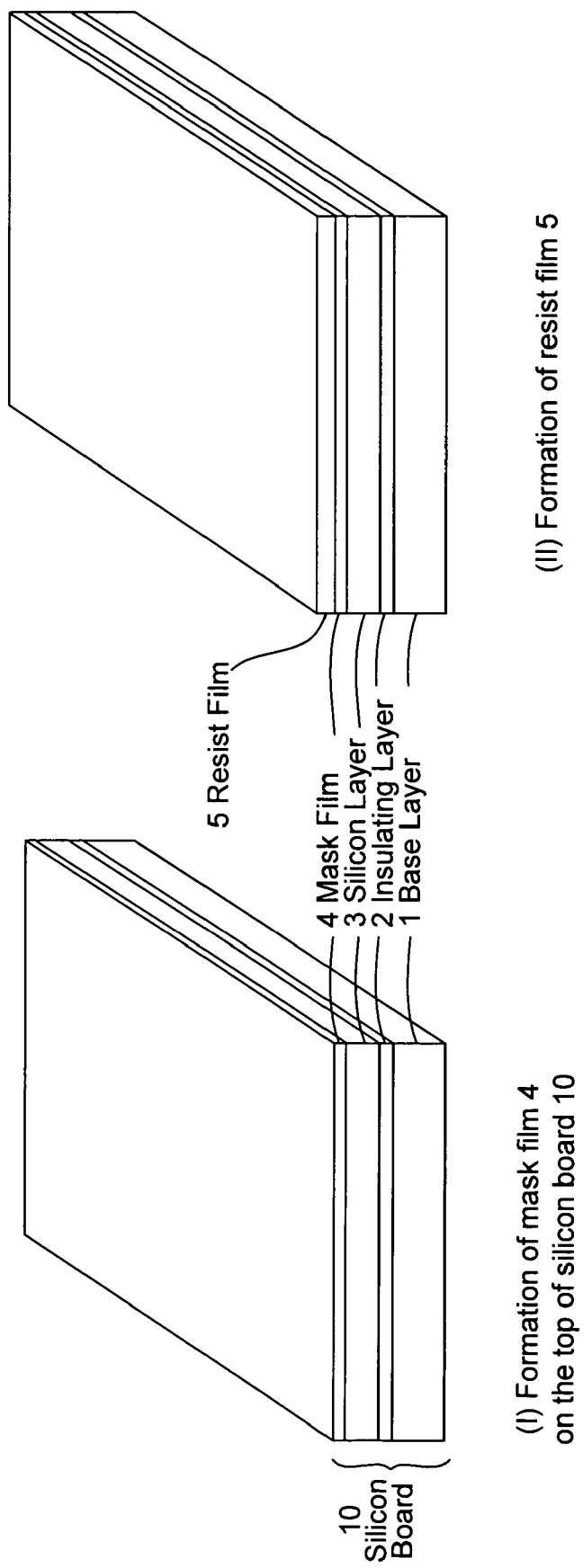
FIGS. 4 to 11 are illustrations of the steps of the process of FIGS. 2 and 3.

As shown in FIGS. 2 and 4 (I), the main material is a silicon board 10 comprising a base layer 1, an insulating layer 2, and a silicon layer 3 with [001] facial orientation. Preferably the silicon board 10 is an SOI (silicon on insulator) board comprising a pair of upper and lower silicon layers and a silicon-oxide layer formed between the upper and lower silicon layers.

The silicon board 10 may be a board comprising a base plate of glass and a single-crystal silicon layer formed on the base plate, or a board comprising a base plate of an amorphous material or polysilicon and an SOI layer formed on the base plate. If the silicon board 10 is a board comprising a top silicon layer with [001] facial orientation and an insulating layer under the top layer, the silicon board 10 may be of three- or four-layer structure.

The base layer 1 is a silicon (100), (111), or (110) base plate or made of silicon such as polysilicon, and is about 500 µm thick.

The base layer 1 may be of polysilicon or glass and preferably has a thickness of 100-1,000 µm.

The insulating layer 2 is of silicon oxide and about 2 µm thick.

Preferably the insulating layer 2 has a thickness of 0.1-5.0 µm.

The silicon layer 3 is of silicon and about 30 µm thick. The surface of the silicon layer 3 has [001] facial orientation. Accordingly, when a zone on the silicon layer 3 is corroded away by etching with aqueous solution of potassium hydroxide and sinks to leave a recess, the bottom of the recess has [001] facial orientation and the side walls of the recess have [010] facial orientation. The details of this etching will be described later.

The first step of the process of producing the nano-gripper is to form a mask film 4 of silicon nitride in the [100] or [010] direction of on the top surface of the silicon layer 3 of the silicon board 10 by vacuum or plasma CVD (chemical vapor deposition), or sputtering (Step 11). The mask film 4 is amorphous and has no crystal orientation.

Next, as shown in FIG. 4 (II), a resist film 5 for photolithography is formed on the mask film 4 by a spin coater or the like (Step 12). Then, a linear mask (not shown) with a width of, for example, 70 µm is formed by photolithography and put on the resist film 5. The resist film 5 and the linear mask are exposed to light and developed to produce a linear strip of resist 51, which has the same width "W" as the linear mask.

The width "W" of the linear strip of resist 51 is one of the important parameters governing the gap, or distance, "d" between the tips of protrusions 72 and 72 of the nano-gripper "G." The width "W" is represented by the following equation.

$$W=2t+d$$

where t is the thickness of the silicon layer 3. If d and t are 10 μm and 30 μm, respectively, W is 70 μm.

Figure 5:
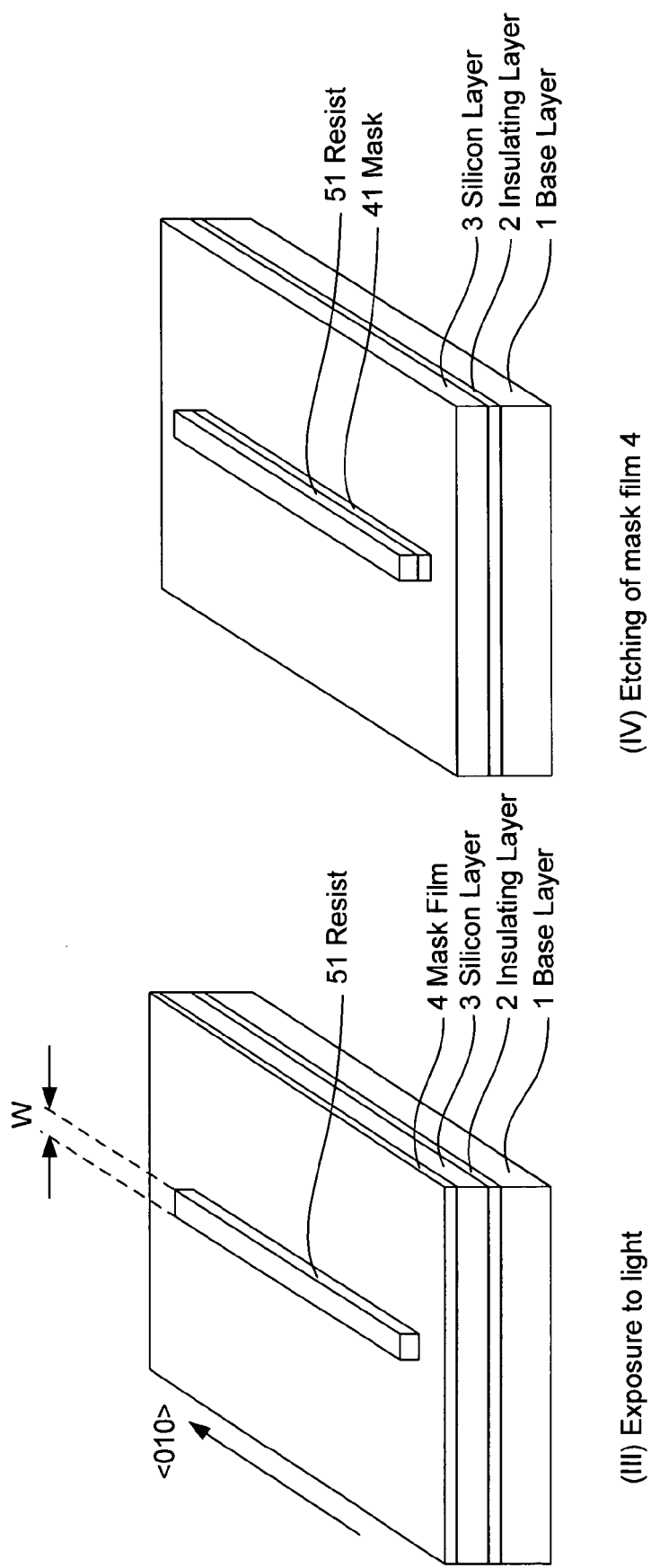

Next, the mask film 4 and the linear strip of resist 51 are exposed to light by an exposure device (Step 13). Then, as shown in FIG. 5 (IV), the mask film 4 undergoes etching by an etching device (an RIE device) (Step 14). Then, a mask-removing liquid is jetted to the mask film 4 to remove it except the part of it under the linear strip of resist 51. Thus, a linear mask 41 is formed under the linear strip of resist 51. The mask 41 has the same width as the above-mentioned linear mask and the linear strip of resist 51. Next, a resist-removing liquid is jetted to the linear strip of resist 51 to remove it and expose the mask 41 (Step 15).

Figure 6:
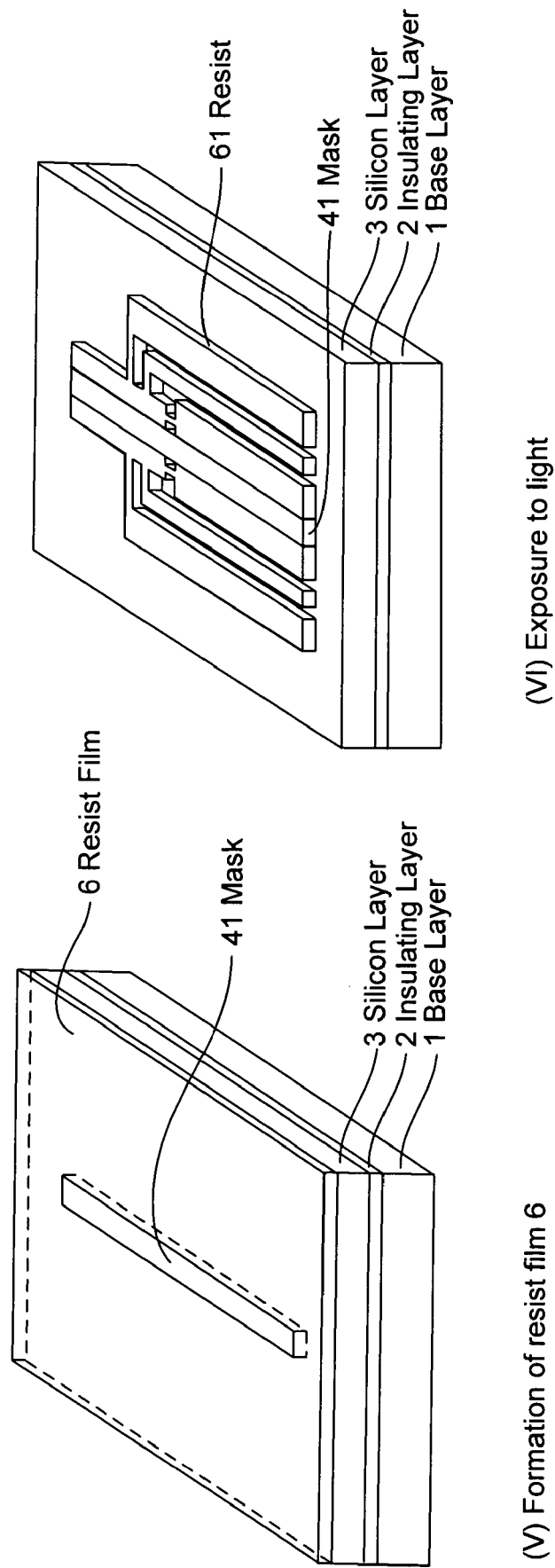

Next, as shown in FIG. 6 (V), a resist film 6 as thick as the mask 41 is formed, around the mask 41, on the silicon layer 3 by a spin coater (Step 16).

Next, a mask for photolithography is put on the resist film 6. The shape of the mask is the same as the shape of the nano-gripper with the mask 41 between the silicon probes 35. The mask for photolithography is put on the resist film 6 and the mask 41 so that the zone of the mask for photolithography corresponding the mask 41 will overlap the mask 41. The mask for photolithography is made by drawing the outline of the mask with a CAD program and drawing the outline on a mask sheet by a mask-producing device. Then, the resist film 6 and the mask for photolithography put on the resist film 6 and the mask 41 are exposed to ultraviolet rays by a photolithography device to produce patterns of resist 61 and 61 on both sides of the mask 41.

Thus, formed on the silicon layer 3 are right and left patterns of resist 61 and 61, which are symmetrical with respect to the longitudinal center line of the mask 41 and have almost the same shapes as the right and left silicon probes 35 and 35 of the nano-gripper "G", respectively.

Next, the silicon layer 3, the right and left patterns of resist 61 and 61, and the mask 41 are exposed to light by an exposure device (Step 17). Thus, the silicon layer 3 is removed except such part of it as is covered by the mask 41 and the patterns of resist 61 and 61. The part of the silicon layer 3 left over is a gripper-in-work 31. The patterns of resist 61 and 61 undergo ICP-RIE (inductively coupled plasma reactive ion etching) (Step 18). Then, the patterns of resist 61 and 61 are removed by a resist-removing liquid. Thus, a gripper-in-work 31 with the mask 41 is exposed as shown in FIG. 7 (VII) (Step 19)

Figure 7:
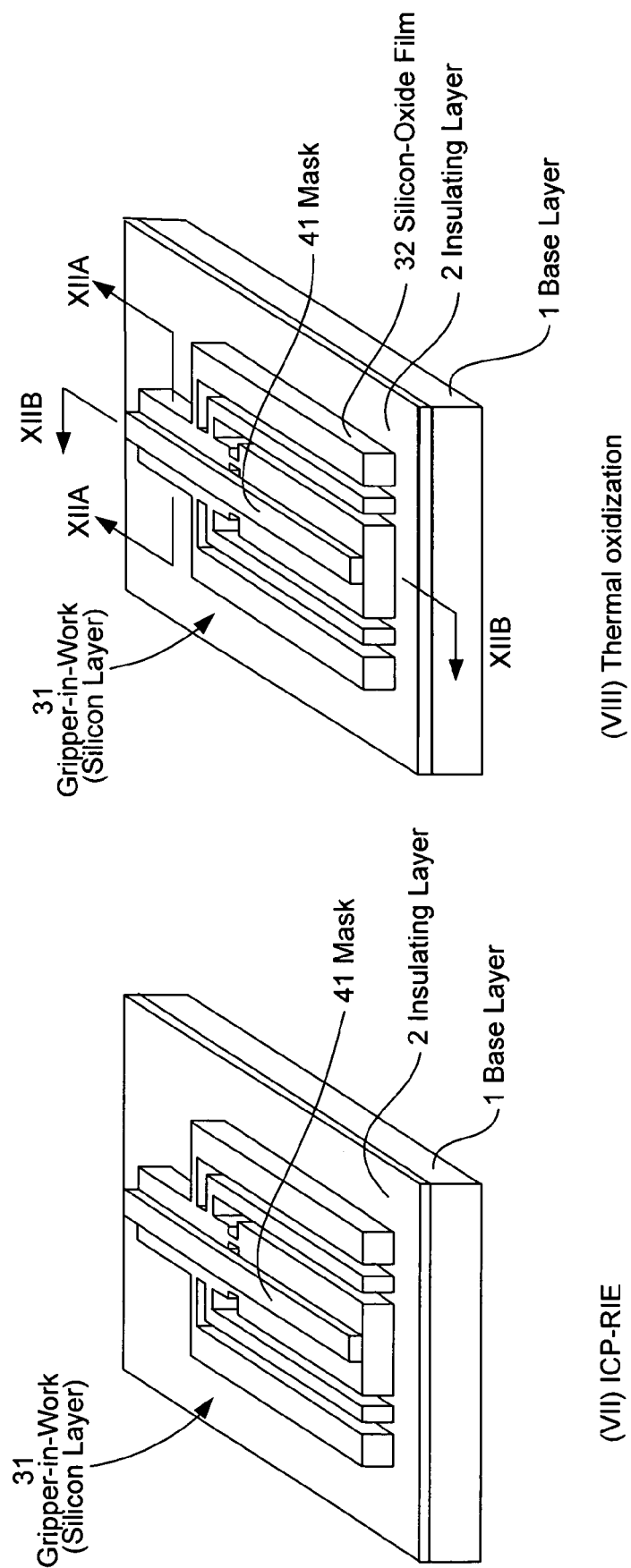

Next, as shown in FIG. 7 (VIII), the gripper-in-work 31 undergoes thermal oxidation in an oxidizing furnace. Accordingly, the exposed surface of the gripper-in-work 31 is oxidized and thus becomes a silicon-oxide film 32, whereas the covered surface of the gripper-in-work 31 under the mask 41 is not oxidized to become a linear silicon zone 33 (Step 20). The silicon zone 33 has the same width as the mask 41.

Figure 8:
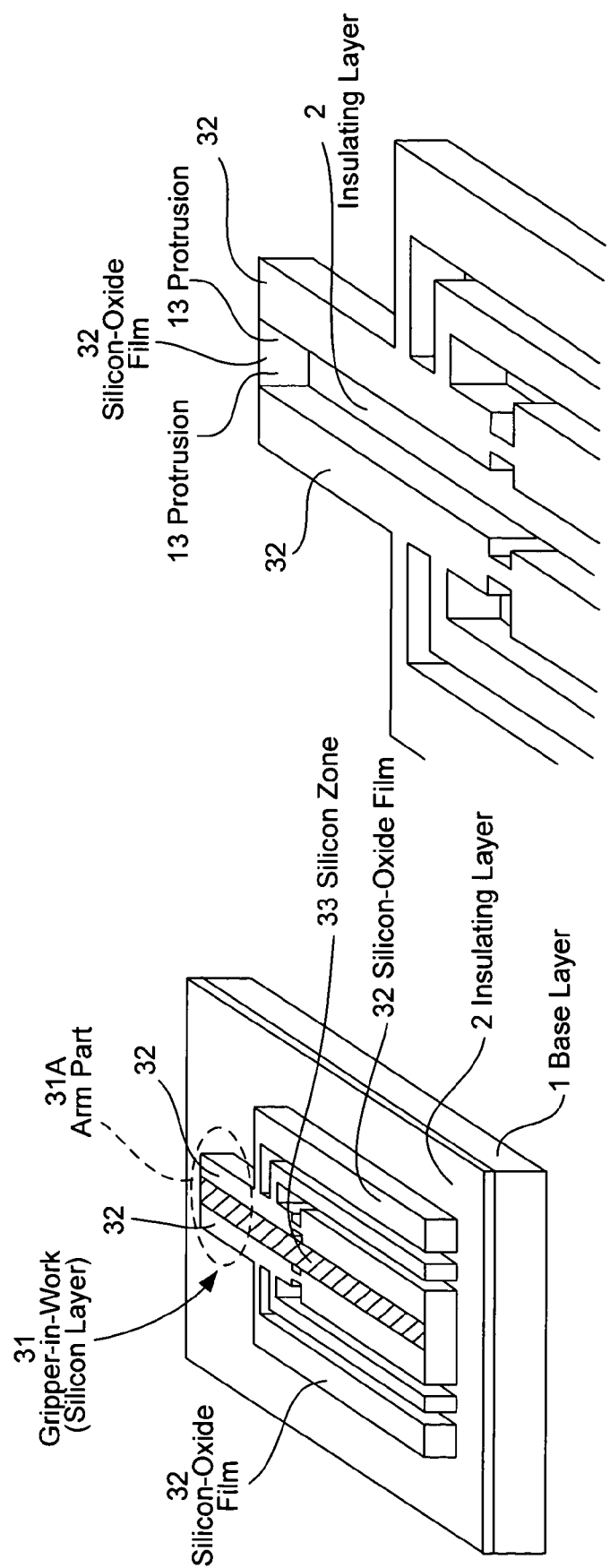

Next, when the mask 41 is removed by an etching device (Step 21), the silicon zone 33 is exposed, as shown in FIG. 8 (IX). Thus, the gripper-in-work 31 except the silicon zone 33 is covered with the silicon-oxide film 32. The reference symbol 31A is the arm part. The silicon zone 33 runs in the center of the arm part 31A, and the right and lest sides of the silicon zone 33 in the arm part 31A are covered with the silicon-oxide film 32.

Next, the silicon zone 33 undergoes etching by aqueous solution of potassium hydroxide of 30 weight percent; accordingly, the silicon in the silicon zone 33 is gradually corroded and the silicon zone 33 sinks.

Figure 14:
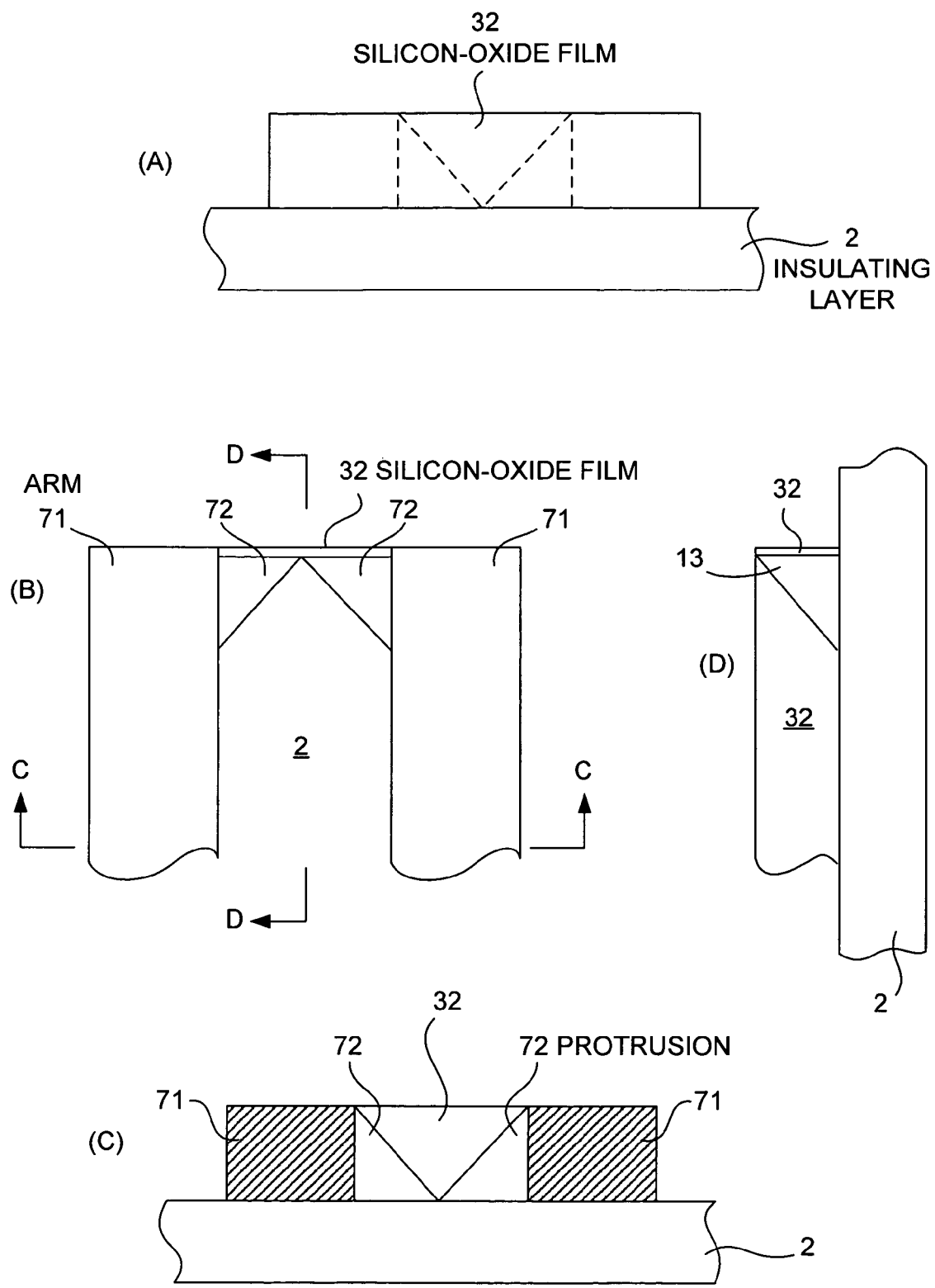
FIG. 14 is illustrations of the formation of the protrusions of the nano-gripper of FIG. 1.

Thus, a ditch-like etching hole 9 is formed in the arm part 31A, its bottom defined by the silicon zone 33 being corroded and sinking, its front end defined by the silicon-oxide film 32, its both sides defined by silicon walls. More specifically, the etching hole 9 is defined by a (001) silicon face at its bottom, a (100) silicon-oxide face at its front end, two (010) silicon faces at its sides. Because the etching is made by aqueous solution of potassium hydroxide, a (100) silicon face is corroded more rapidly than a (111) silicon face. Accordingly, as the etching progresses, a silicon crystal is deposited in each of the right and left front-end corners of the etching hole 9 as shown in FIG. 14. The two silicon crystals become the protrusions 72. Because each silicon crystal is deposited on the basis of the (001) face, the (100) face, and one of the two (010) faces, a (111) silicon face is formed and exposed. Accordingly, each protrusion 72 is a triangular pyramid with (001), (100), and (111) side faces. Thus, two protrusions 72 and 72 are formed between the arms 71 and 71, symmetrically with respect to the longitudinal center line between the arms 71 and 71, as shown in FIGS. 8 (X) and 13. Because the silicon-oxide film 32 has [100] facial orientation at the front end of the etching hole 9, each protrusion 72 is deposited at the angle of 54.7° to the silicon-oxide film 32 at the front end of the etching hole 9.

As described above, the protrusions 72 and 72 are formed at the tips of the arms 71 and 71. In addition, because the protrusions 72 and 72 are formed along the (100) face of the silicon-oxide film 32 at the front end of etching hole 9, the tips of protrusions 72 and 72 face each other directly.

Figure 3:
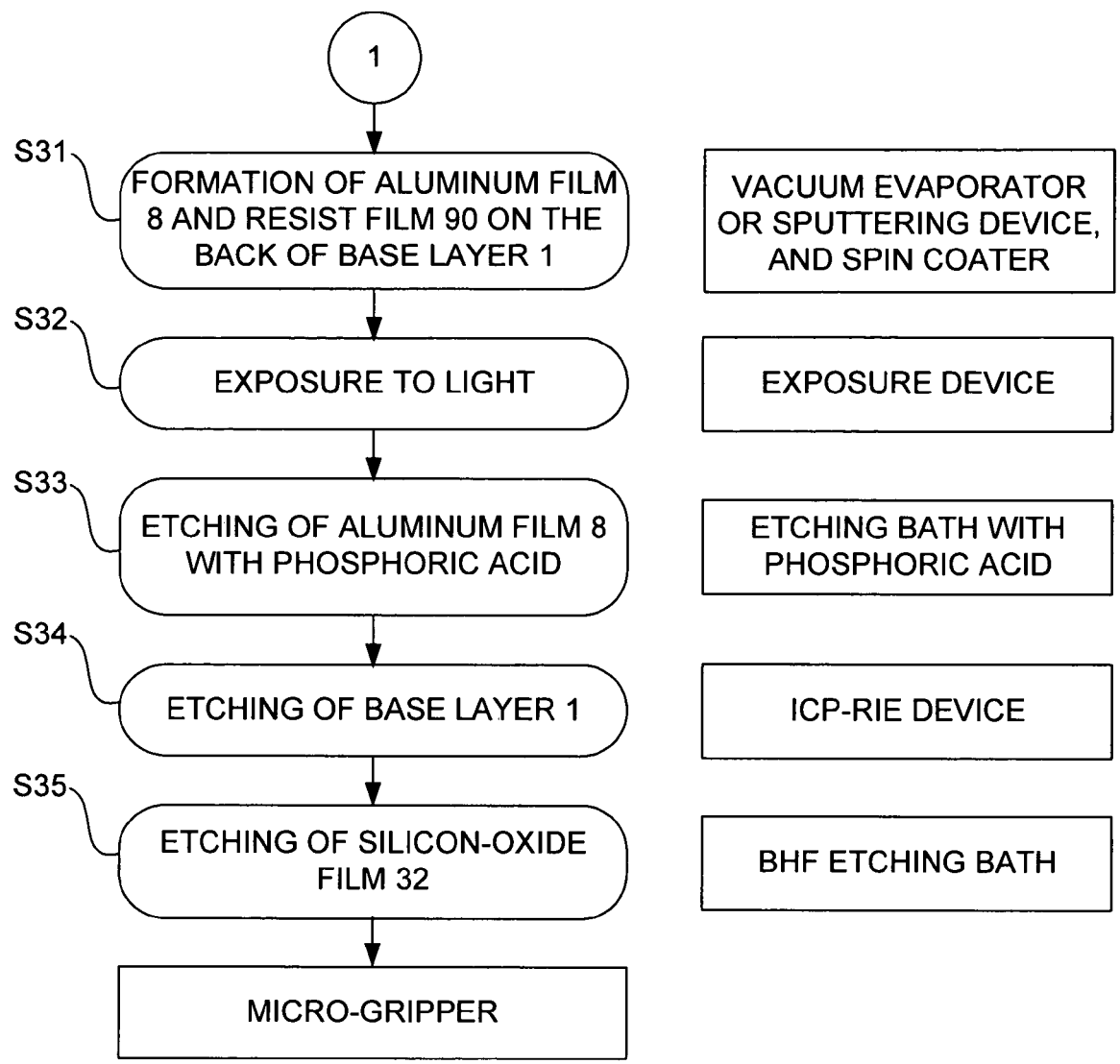
Figure 9:
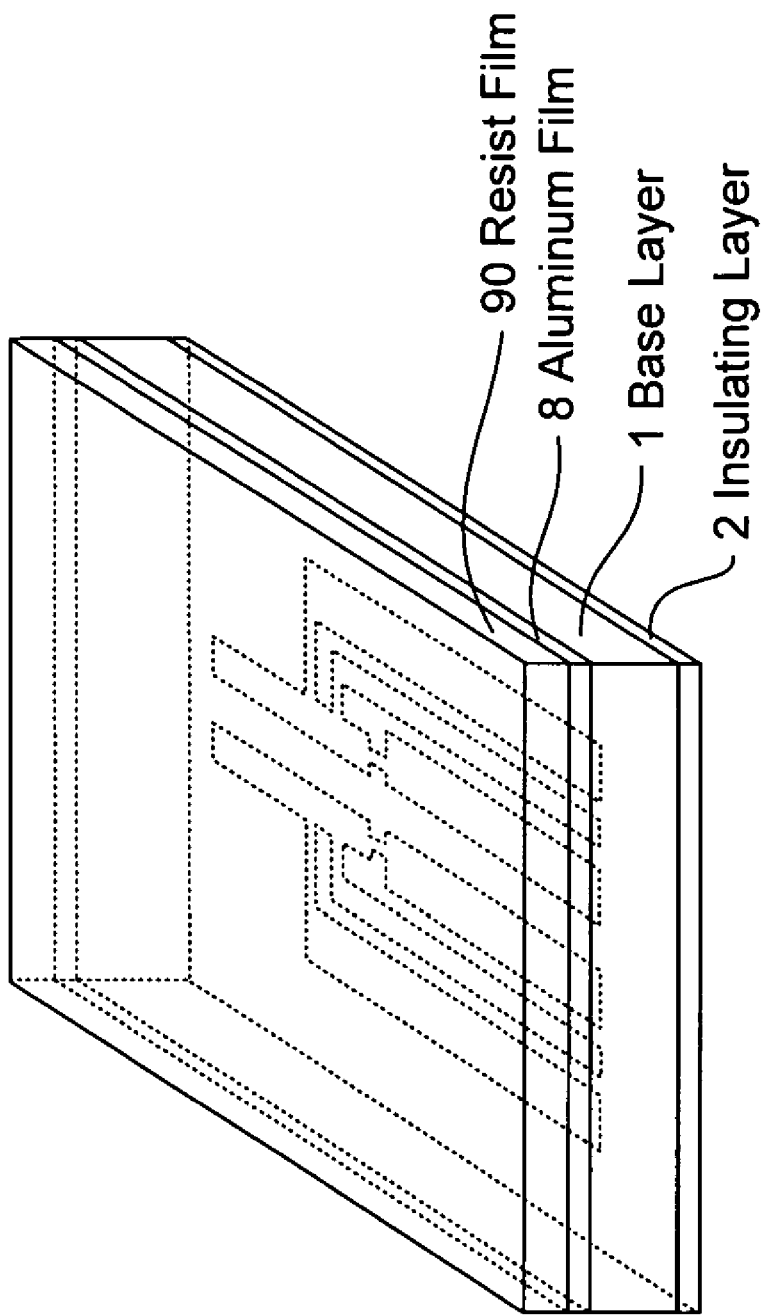

The flowchart of FIG. 2 is continued to that of FIG. 3. As shown in FIGS. 3 and FIG. 9 (XII), an aluminum film 8 is formed on the bottom surface of the base layer 1 by a vacuum evaporator or a sputtering device, and a resist film 90 is formed on the back of the aluminum film 8 by a spin coater (Step 31).

A mask (not shown) of the same shape as the base 11 of the nano-gripper is put on the resist film 90. Then, the resist is developed to remove the resist and aluminum films 90 and 8 except the parts of them under the mask. Thus, left under the mask are a resist film 91 and an aluminum film 81 as shown in FIG. 10 (XIII).

Figure 10:
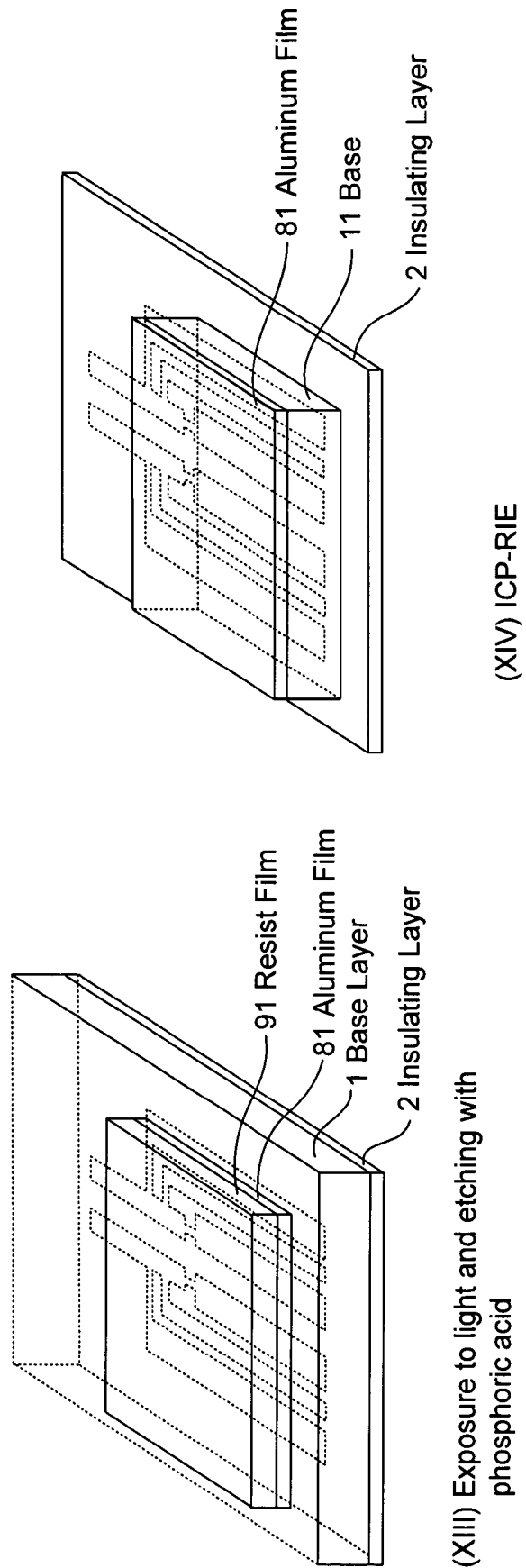
Figure 11:
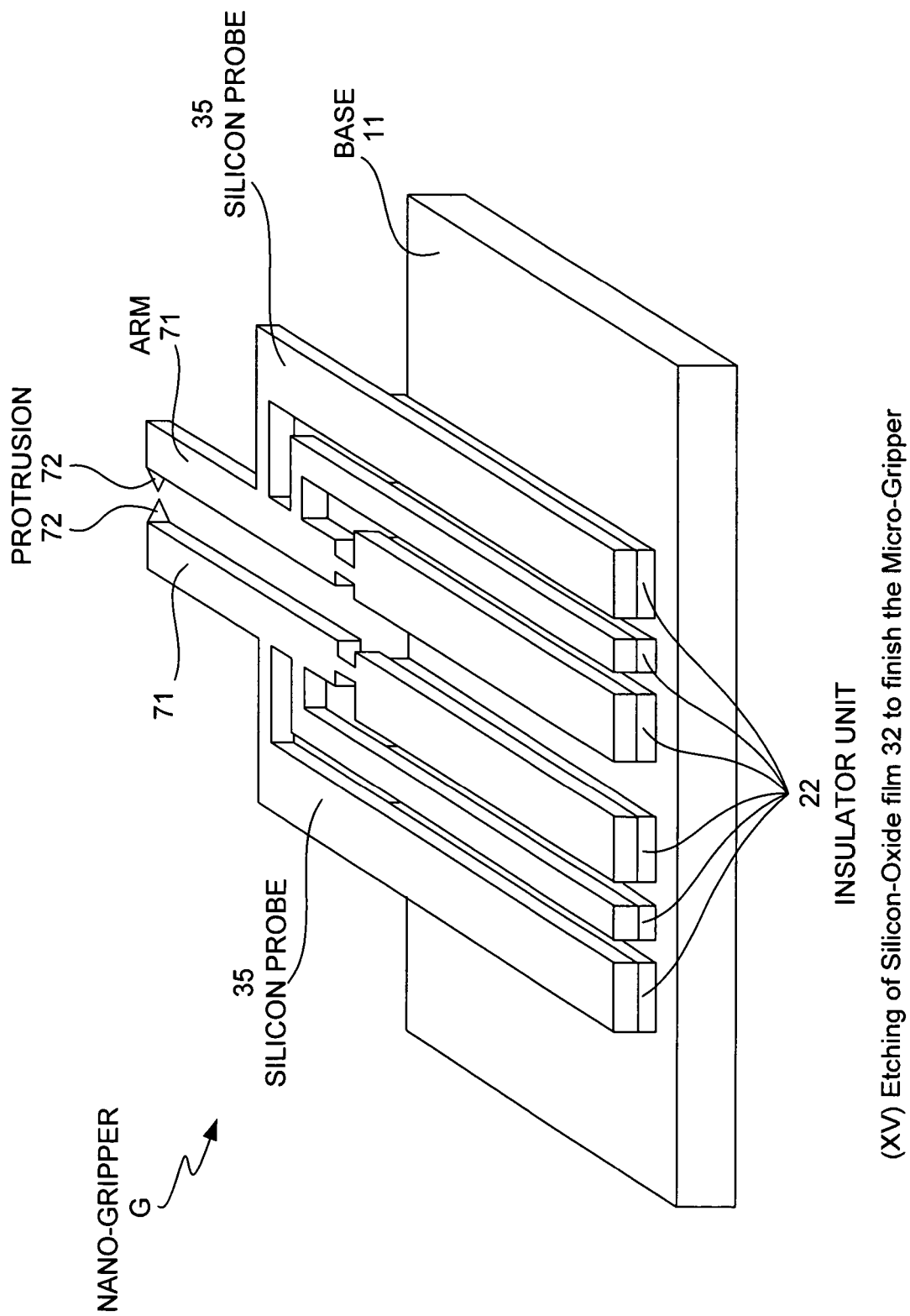
Figure 12:
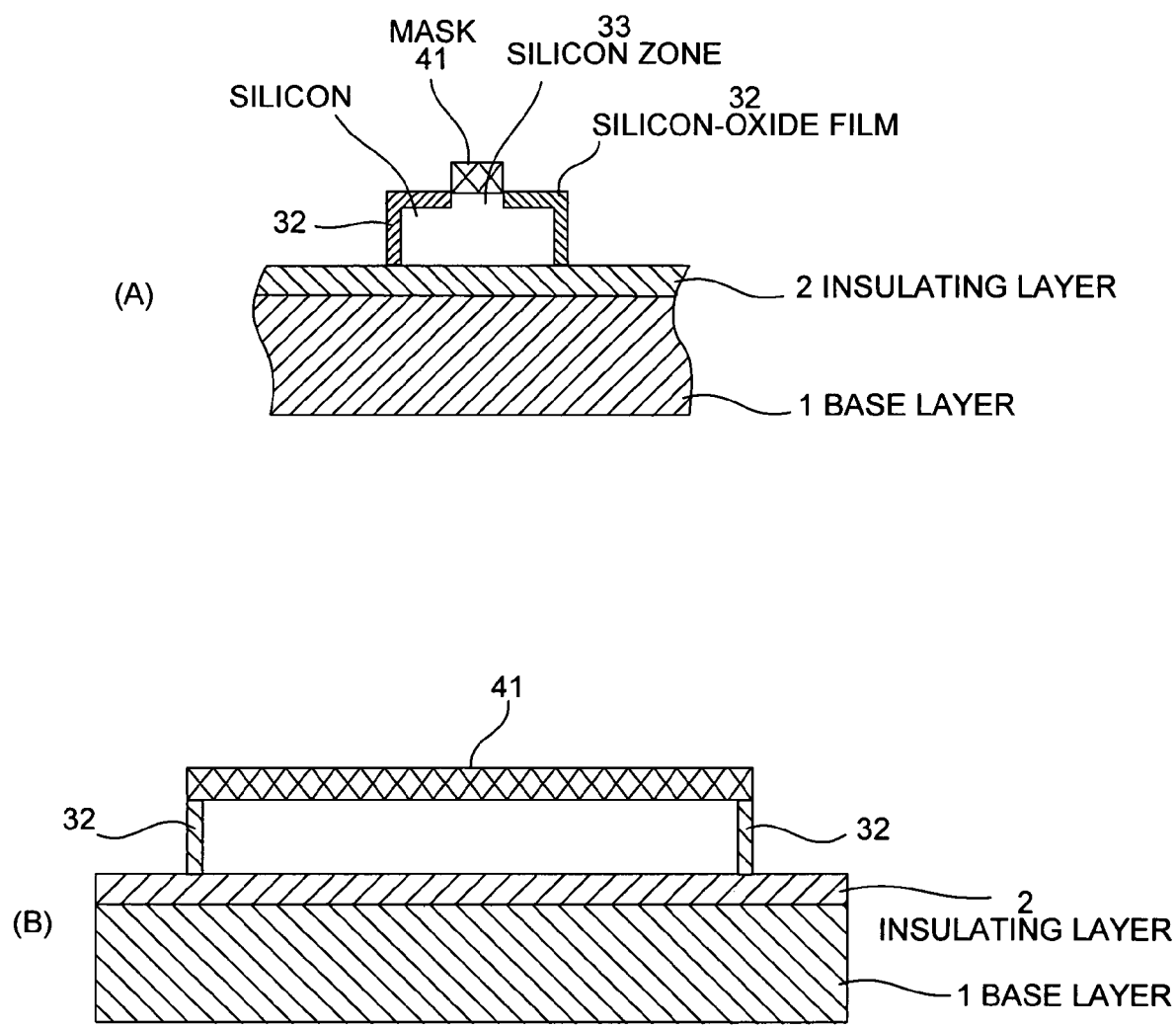
FIG. 12(A) is a sectional view taken along the allowed line XIIA-XIIA of FIG. 7.
FIG. 12(B), along the allowed line XIIB-XIIB.
Figure 13:
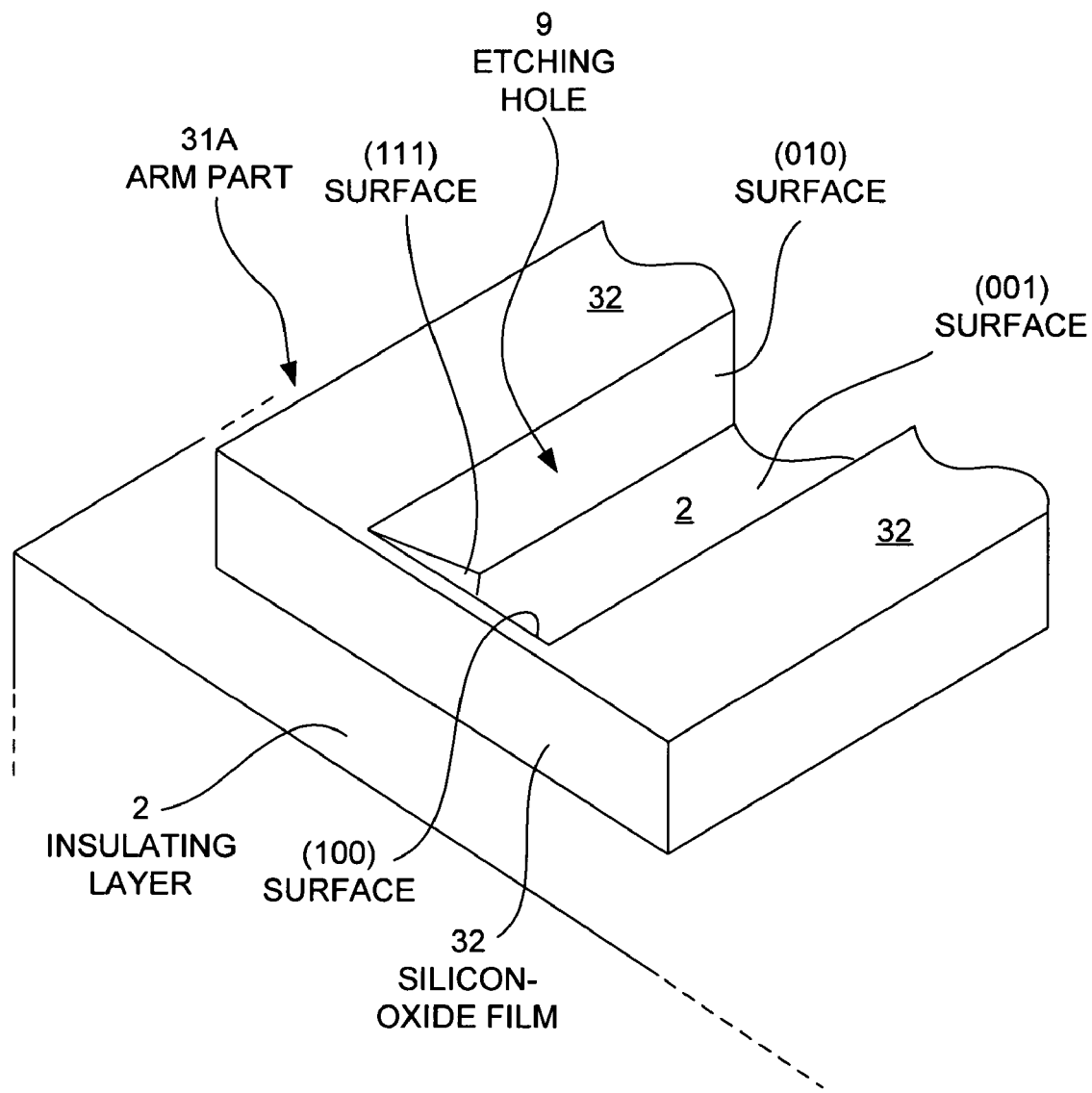
FIG. 13 is an enlarged view of the part of the arms of the nano-gripper of FIG. 1.

As shown in FIG. 10 (XIII), the resist film 91 and the base layer 1 are exposed to light by an exposure device (Step 32). Then, the aluminum film 81 undergoes etching with phosphoric acid by using a phosphoric-acid etching bath to remove the resist film 91 (Step 33).

As shown in FIG. 10 (XIV), the base layer 1 and the aluminum film 81 undergo etching by an ICP-RIE device to remove the base layer 1 except the part of it covered by the aluminum film 81, the part becoming the base 11 (Step 34).

Lastly, the gripper-in-work 31 undergoes etching with hydrogen fluoride in a BHF etching bath for removal of the silicon-oxide film 32.

Through the above process, the nano-gripper "G" of the present invention is produced.

Now the working and effect of the nano-gripper of the present invention will be described below.

According to the process of producing the nano-gripper of the present invention, the surface of the gripper-in-work 31 is oxidized to become a silicon-oxide film 32, except the part (silicon zone 33) of the surface cover by the mask 41, in the step of thermal oxidization. Then, the mask 41 is removed to expose the silicon zone 33 in the step of mask removal, and the silicon zone 33 is corroded with aqueous solution of potassium hydroxide and sinks in the step of silicon etching. Accordingly, the etching hole 9 is formed, its bottom defined by the silicon zone 33 being corroded and sinking, its front end defined by the silicon-oxide film 32, its both sides defined by silicon walls. As the etching progresses, a protrusion 72 is formed on the basis of the (001), (100), and (010) faces in each of the right and left front-end corners of the etching hole 9. Each protrusion 72 is a triangular pyramid with (001), (100), and (111) side faces. Because one protrusion 72 is formed in the right front-end corner of the etching hole 9 and the other protrusion 72 is formed in the left front-end corner, they are formed on the front-end opposite faces of the arms 71 and 71, their tips facing each other directly. Then, the silicon-oxide film 32 is removed in the step of removal of the silicon-oxide film, and the part of the insulating layer 2 under the arms 71 and 71 is removed in the step of removal of the insulating layer. Thus, the shapes of the paired protrusions 72 and 72 are determined by crystal faces, and they, facing each other, are formed on the straight line of one crystal orientation; therefore, the tips of protrusions 72 and 72 are given a radius of curvature of 50 nm or less without using high-precision lithography.

Accordingly, the nano-gripper "G" is suitable for handling very minute nano-objects such as DNA's and cells. Because the tips of protrusions 72 are as minute as objects to be handled, the electric properties of carbon nanotubes, nanocrystals, and so on can be measured.

Now, the nano-gripper "G" produced through the above process will be described in detail.

As shown in FIG. 1, a pair of right and left silicon probes 35 and 35 is formed on a pair of right and left insulator units 22 and 22, which is formed on a base 11. The width, length, and height of the base 11 are about 5 mm, 10 mm, and 0.5 mm, respectively. These dimensions are mere examples and may be set to any values depending on various uses.

Each insulator unit 22 comprises 2 μm thick silicon-oxide layer strips 21A, 21B, and 21C. As each strip is made of silicon oxide alone, it functions as an insulator.

Next, silicon probes 35 will be described below.

The paired right and left silicon probes 35 are symmetrical with respect to the center line therebetween. As the silicon probes 35 are made of silicon, they are conductive. When electricity flows through them, they expand with heat. Each silicon probe 35 comprises an arm 71, a protrusion 72, a hinge 73, and an actuator including parts 75 and 76, all formed as one body.

The width and length of each arm 71 are about 250 μm and 1,250 μm, respectively. Protrusions 72 and 72 are formed on the front-end opposite faces of the arms 71 and 71. The insulator units 22 and 22 do not extend under the arms 71 and 71; accordingly, the arms 71 and 71 can easily be swung.

Each protrusion 72 is in the shape of triangular pyramid with (001), (100), and (111) side faces, and its tip is sharp. The tips of the protrusions 72 and 72 face each other and the gap therebetween is about 10 μm.

Each arm 71 is supported on a hinge 73, which is supported on a support 74; accordingly, when each arm 71 is pushed and pulled, it swings.

A pair of L-shaped parts 75 and 76 extends from the outside of each arm 71. The parts 75 and 76 of each arm 71 constitute an actuator and are provided with electrodes 75e and 76e, respectively.

The support 74 and the parts 75 and 76 of each silicon probe 35 are formed on the silicon-oxide layer strips 21A, 21B, and 21C, respectively, of the insulator unit 22 of said silicon probe 35.

When a power supply connected to the electrodes 75e and 76e of the actuators is turned on, the actuators expand with Joule heat and push the arms 71, which swing on the hinges 73.

With the above configuration, when the power supply is turned on, the gap between the tips of the protrusions 72 and 72 is narrowed. Thus, the nano-gripper "G" can handle nano-objects such as DNA's, catching and releasing them.

In the above embodiment of the nano-gripper, although each arm has an actuator on one side alone to push it in one direction alone, it may have another actuator on the other side so that it can be pushed in two directions. Such actuators may be of an electrostatic type or a piezoelectric type.

Figure 15:
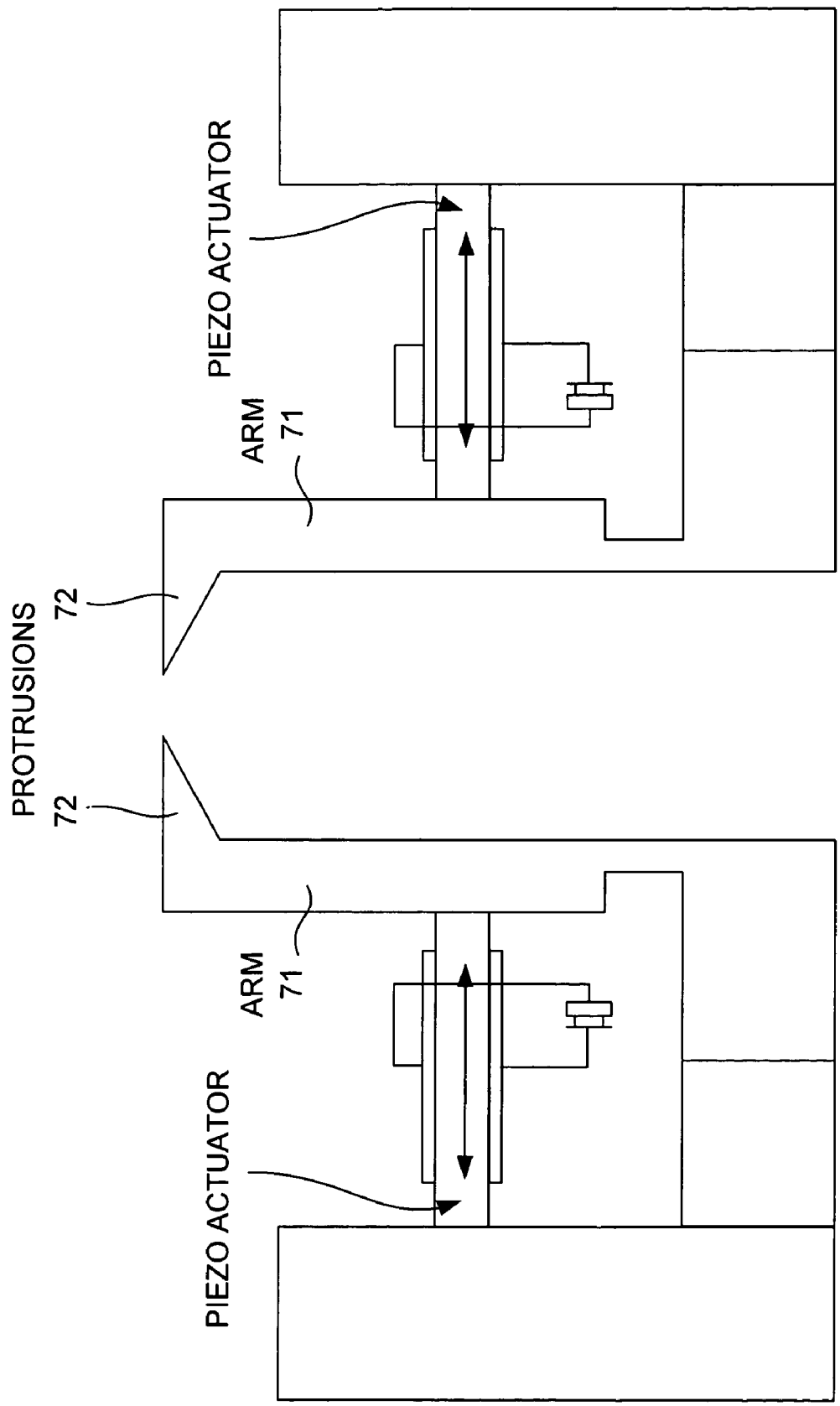
FIG. 15 is an illustration of another embodiment of the nano-gripper of the present invention.

Another embodiment of the nano-gripper of the present invention is shown in FIG. 15. The nano-gripper is provided with piezoelectric actuators. The minute movement of the piezoelectric actuator can be controlled by voltage and it is free from drift; accordingly, it is suitable for minute positioning.

Figure 16:
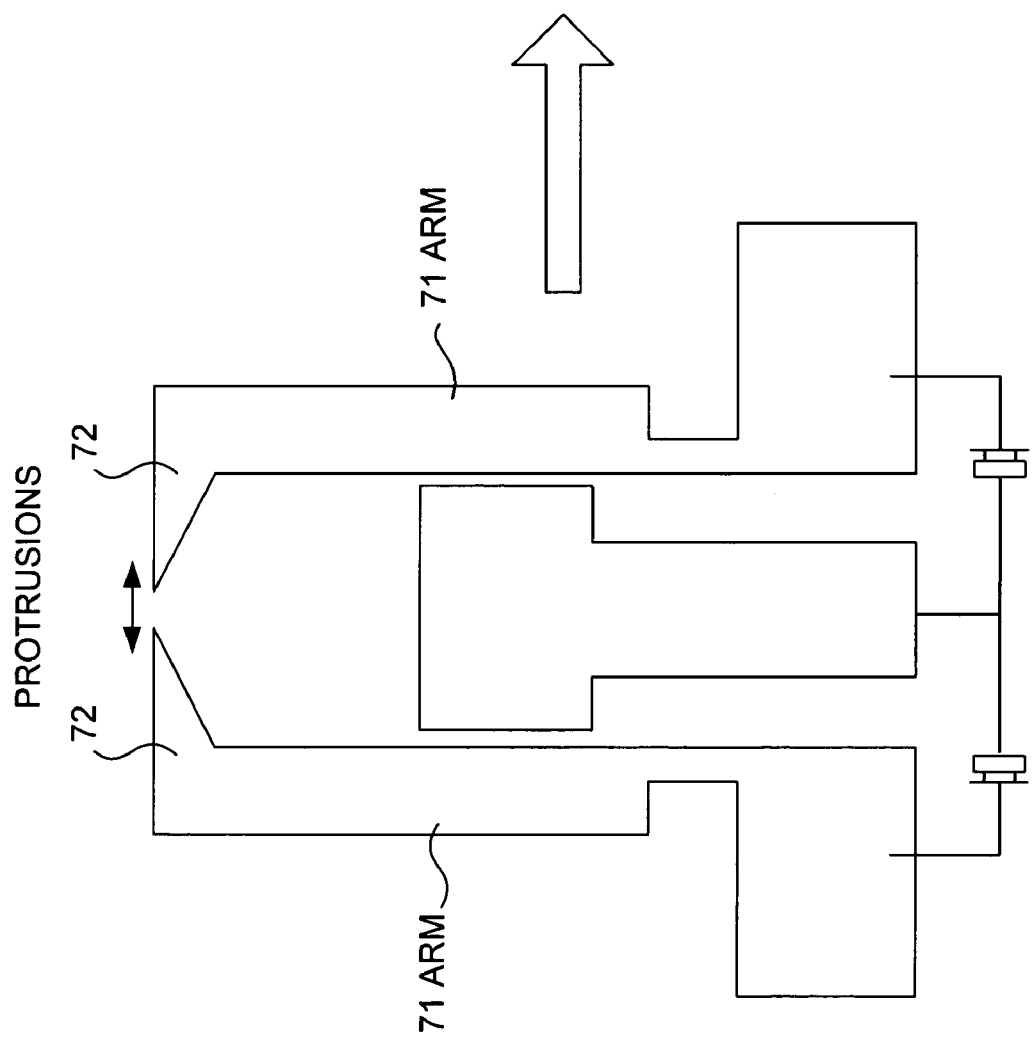
FIG. 16 is an illustration of still another embodiment of the nano-gripper of the present invention.

Yet another embodiment of the nano-gripper of the present invention is shown in FIG. 16. The nano-gripper is provided with electrostatic actuators, which make use of electrostatic force. A probe and an electrostatic actuator can easily be formed as one body and the displacement of the arm of the probe can be measured by measuring the capacitance of the actuator. Thus, the electrostatic actuator is preferable.

INDUSTRIAL APPLICABILITY

According to the first feature of the invention, the paired protrusions are formed along the silicon-oxide film parallel to a 100 face of the silicon crystal; accordingly, the tips of the protrusions are formed on one and the same axis, face to face with each other. Therefore, when the gap between the front ends of the paired arms is narrowed, the gap between the tips of the protrusions is narrowed. Thus, nano-objects such as DNA's can be caught between the protrusions and released from between them.

According to the second feature of the invention, because the protrusions on the paired arms of the nano-gripper are hard silicon crystals, its probe structure is not affected even when the tips of the arms are dipped in a solution. Besides, the tip of the protrusion of each arm is the apex of a silicon crystal with (001), (100), and (111) side faces, its radius of curvature is as minute as 50 nm or less; therefore, the nano-gripper can handle DNA's in a solution, catching and releasing them.

According to the third feature of the invention, the gap between the tips of the protrusions of the paired arms of the nano-gripper is narrowed and widened by extending and contracting the actuator of the nano-gripper. Thus, the nano-gripper can handle nano-objects, catching and releasing them.

According to the fourth feature of the invention, because the expansion and contraction of the thermal-expansion actuators of the nano-gripper can be adjusted by changing the heating values of the actuators, the pinching force of the nano-gripper can easily be adjusted.

According to the fifth feature of the invention, because the nano-gripper including its actuators can be formed as a single piece out of a single silicon board 10, the nano-gripper can be mass-produced easily and inexpensively. Besides, because the expansion and contraction of the pairs of silicon arms of the actuators can be adjusted by changing the currents flowing through the pairs of silicon arms, the pinching force of the nano-gripper can easily be adjusted and the gap between the tips of the paired protrusions can precisely be controlled.

According to the sixth feature of the invention, the surface of the gripper-in-work is oxidized to become a silicon-oxide film, except the zone of the surface cover by the mask, in the step of thermal oxidization. Then, the mask is removed to expose the silicon zone in the step of mask removal, and the silicon zone is corroded with aqueous solution of potassium hydroxide and sinks in the step of silicon etching. Accordingly, an etching hole is formed, its bottom defined by the silicon zone being corroded and sinking, its front end defined by the silicon-oxide film, its both sides defined by silicon walls. More specifically, the etching hole is defined by a (001) silicon face at its bottom, a (100) silicon-oxide face at its front end, two (010) silicon faces at its sides. As the etching progresses, a protrusion is formed on the basis of the (001), (100), and (010) faces in each of the right and left front-end corners of the etching hole. Each protrusion 72 is a triangular pyramid with (001), (100), and (111) side faces. Because one protrusion 72 is formed in the right front-end corner of the etching hole 9 and the other protrusion 72 is formed at the left front-end corner, they are formed on the front-end opposite faces of the arms, their tips facing each other directly. Then, the silicon-oxide film of the gripper-in-work is removed in the step of removal of the silicon-oxide film, and the part of the insulating layer under the arms of the gripper-in-work is removed in the step of removal of the insulating layer to finish the nano-gripper. Thus, the shapes of the paired protrusions are determined by crystal faces, and they, facing each other, are formed on the straight line of one crystal orientation; therefore, the tips of protrusions are given a radius of curvature of 50 nm or less without using high-precision lithography.

According to the seventh feature of the invention, an etching hole defined by 001, 100, and 010 faces, or planes, is formed by etching the silicon zone. While the etching is progressing, silicon crystal is deposited on the basis of 001, 100 and 010 faces of the etching hole; accordingly, a triangular pyramid of silicon crystal with 001, 100 and 111 side faces is deposited in each of the two corners of the etching hole defined by 100 and 010 faces. Besides, by forming silicon-oxide film on the exposed surface of the gripper-in-work, silicon-oxide film is formed on the front-end face of the silicon zone and the front-end faces of the arms of the gripper-in-work, parallel to the 100 face of the silicon crystal. Accordingly, a pair of protrusions is formed along the silicon-oxide film parallel to the 100 face of the silicon crystal and the tips of the paired protrusions are disposed on one and the same axis and face each other. Thus made is a nano-gripper with paired protrusions whose tips are disposed on one and the same axis and face each other.

According to the eighth feature of the invention, an etching hole defined by 001, 100 and 010 faces, or planes, is formed by etching the exposed narrow, long silicon part. While the etching is progressing, silicon crystal is deposited on the basis of 001, 100 and 010 faces of the etching hole; accordingly, a triangular pyramid of silicon crystal with 001, 100 and 111 side faces is deposited in each of the two corners of the etching hole defined by 100 and 010 faces. Thus, a pair of protrusions are so formed that the tips of the paired protrusions are disposed on one and the same axis and face each other.

According to the ninth feature of the present invention, a pair of protrusions is formed so that each protrusion have a face of 100 facial orientation; therefore, the tips of the paired protrusions are disposed on one and the same axis and face each other."

The invention claimed is:

1. A nano-gripper comprising;
   a pair of arms disposed side by side, each arm having a base portion, the base portions of the arms being fixed to a base, each arm having a face at its front end, the front-end faces of the arms facing each other; and
   a protrusion with a tip formed on the front-end face of each arm, the tips of the protrusions facing each other,
   the pair of protrusions being etched to a silicon crystal disposed between the front-end faces, the silicon crystal having a silicon-oxide film parallel to a (100) face of the silicon crystal and perpendicular to the front-end faces;
   wherein each of the paired protrusions is a triangular-pyramidal silicon crystal with (011), (100), (111) side faces.

2. The nano-gripper according to claim 1 further comprising a pair of actuators, one of the actuators moving one of the arms and the other actuator moving the other arm to narrow and widen the gap between the tips of the protrusions 3. The nano-gripper according to claim 2, wherein the actuators are of a type of thermal expansion.

4. The nano-gripper according to claim 3 wherein each of the thermal expansion-type actuators comprises a pair of expandable and contractable silicon arms and each arm has an electrode for letting electricity flow through the arms.

5. The nano-gripper according to claim 1, wherein the paired arms and the paired protrusions are formed out of a single base silicon crystal by forming silicon-oxide film on the face of (100) facial orientation except narrow, long part of the face extending in the <010> direction and etching the exposed narrow, long silicon part.

6. The nano-gripper according to claim 5, wherein one end of the narrow, long part of the face is formed parallel to the face of (100) facial orientation.

7. A nano-gripper comprising;
   a pair of arms disposed side by side, each arm having a base portion, the base portions of the arms being fixed to a base, each arm having a face at its front end, the front-end faces of the arms facing each other;
   a protrusion with a tip formed on the front-end face of each arm, the tips of the protrusions facing each other;
   the pair of protrusions being etched to a silicon crystal disposed between the front-end faces, the silicon crystal having a silicon-oxide film parallel to a (100) face of the silicon crystal and perpendicular to the front-end faces; and
   a pair of actuators, one of the actuators moving one of the arms and the other actuator moving the other arm to narrow and widen the gap between the tips of the protrusions.

8. The nano-gripper according to claim 7 wherein the actuators functions by using thermal expansion.

9. The nano-gripper according to claim 8 wherein each of the thermal expansion-type actuators comprises a pair of expandable and contractable silicon arms and each arm has an electrode for letting electricity flow through the arms.

10. A nano-gripper comprising;
a pair of arms disposed side by side, each arm having a base portion, the base portions of the arms being fixed to a base, each arm having a face at its front end, the front-end faces of the arms facing each other; and
a protrusion with a tip formed on the front-end face of each arm, the tips of the protrusions facing each other, the pair of protrusions being etched to a silicon crystal disposed between the front-end faces, the silicon crystal having a silicon-oxide film parallel to a (100) face of the silicon crystal and perpendicular to the front-end faces;
wherein said protrusions have a cross-sectional area that decreases monotonically towards said tip.

11. A nano-gripper comprising;
a pair of arms disposed side by side, each arm having a base portion, the base portions of the arms being fixed to a base, each arm having a face at its front end, the front-end faces of the arms facing each other; and
a protrusion with a tip formed on the front-end face of each arm, the tips of the protrusions facing each other, the pair of protrusions being etched to a silicon crystal disposed between the front-end faces, the silicon crystal having a silicon-oxide film parallel to a (100) face of the silicon crystal and perpendicular to the front-end faces;
wherein the paired arms and the paired protrusions are formed out of a single base silicon crystal by forming silicon-oxide film on the face of (100) facial orientation except narrow, long part of the face extending in the <010> direction and etching the exposed narrow, long silicon part.

12. The nano-gripper according to claim 11, wherein one end of the narrow, long part of the face is formed parallel to the face of (100) facial orientation.

* * * * *